(12) United States Patent
Cabral, Jr. et al.

(10) Patent No.: US 6,716,708 B2
(45) Date of Patent: Apr. 6, 2004

(54) SELF-ALIGNED SILICIDE PROCESS UTILIZING ION IMPLANTS FOR REDUCED SILICON CONSUMPTION AND CONTROL OF THE SILICIDE FORMATION TEMPERATURE AND STRUCTURE FORMED THEREBY

(75) Inventors: Cyril Cabral, Jr., Ossining, NY (US); Kevin Kok Chan, Staten Island, NY (US); Guy Moshe Cohen, Mohegan Lake, NY (US); Kathryn Wilder Guarini, Yorktown Heights, NY (US); Christian Lavoie, Ossining, NY (US); Ronnen Andrew Roy, Ossining, NY (US); Paul Michael Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/299,688

(22) Filed: Nov. 20, 2002

(65) Prior Publication Data

US 2003/0132487 A1 Jul. 17, 2003

Related U.S. Application Data

(62) Division of application No. 09/875,187, filed on Jun. 7, 2001, now Pat. No. 6,555,880.

(51) Int. Cl.[7] .............................................. H01L 21/336
(52) U.S. Cl. ........................ 438/299; 438/305; 438/680
(58) Field of Search ................................. 257/383, 384, 257/751, 754; 438/299, 305, 656, 680

(56) References Cited

U.S. PATENT DOCUMENTS

| | | | |
|---|---|---|---|
| 5,217,923 A | * | 6/1993 | Suguro ........................ 438/305 |
| 5,773,331 A | | 6/1998 | Solomon et al. |
| 6,051,473 A | | 4/2000 | Ishida et al. |
| 6,072,222 A | * | 6/2000 | Nistler ........................ 257/383 |
| 6,204,177 B1 | * | 3/2001 | Besser et al. ................ 438/683 |
| 6,214,670 B1 | | 4/2001 | Shih et al. |
| 6,228,728 B1 | | 5/2001 | Furukawa et al. |
| 6,265,293 B1 | | 7/2001 | Yu |
| 6,346,732 B1 | | 2/2002 | Mizushima et al. |
| 6,461,923 B1 | * | 10/2002 | Hui et al. .................... 438/305 |

OTHER PUBLICATIONS

Lisa T. Su, et al., IEEE Electron Device Letters, vol. 15, No. 9, Sep. 1994, Optimization of Series Resistance in Sub–0.2 um SOI MOSFET's pp. 363–365.
T. Yoshitomi, et al., 1995 Symposium on VLSI Technology Digest of Technical Papers, Silicided Silicon–Sidewall Source and Drain (S4D) structure for high–performance 75–nm gate length pMOSFET's, pp. 11–12.
U.S. patent application No. 09/515,033, YOR900–0044US1, "Method For Self–Aligned Formation Of Silicide Contacts Using Metal Silicon Alloys For Limited Silicon Consumption And For Reduction Of Bridging", pp. 1–21, and Figs. 1A–3.
U.S. patent application No. 09/712,264, filed Nov. 15, 2000.
U.S. patent application No. 09/569,306, filed May 11, 2000.
U.S. patent application No. 09/515,033, filed Mar. 6, 2000.

* cited by examiner

Primary Examiner—David Nelms
Assistant Examiner—Dao H. Nguyen
(74) Attorney, Agent, or Firm—Wan Yee Cheung, Esq.; McGinn & Gibb, PLLC

(57) ABSTRACT

A method (and resultant structure) for forming a metal silicide contact on a silicon-containing region having controlled consumption of said silicon-containing region, includes implanting Ge into the silicon-containing region, forming a blanket metal-silicon mixture layer over the silicon-containing region, reacting the metal-silicon mixture with silicon at a first temperature to form a metal silicon alloy, etching unreacted portions of the metal-silicon mixture layer, forming a blanket silicon layer over the metal silicon alloy layer, annealing at a second temperature to form an alloy of metal-$Si_2$, and selectively etching the unreacted silicon layer.

31 Claims, 12 Drawing Sheets

SELF-ALIGNED SILICIDE PROCESS UTILIZING ION IMPLANTS FOR REDUCED SILICON CONSUMPTION AND CONTROL OF THE SILICIDE FORMATION TEMPERATURE AND STRUCTURE FORMED THEREBY

The present Application is a Divisional Application of U.S. patent application Ser. No. 09/875,187, filed on Jun. 7, 2001, now U.S. Pat. No. 6,555,880.

CROSS-REFERENCE TO RELATED APPLICATIONS

The present application is related to U.S. patent application Ser. No. 09/712,264, filed on Nov. 15, 2000, to Ajmera et al., entitled "SELF-ALIGNED SILICIDE (SALICIDE) PROCESS FOR STRAINED SILICON MOSFET ON SiGe AND STRUCTURE FORMED THEREBY", having IBM Docket No. YOR9-2000-0373US1, to U.S. patent application Ser. No. 10/156,782, filed on May 9, 2002, to Cabral et al., entitled "ULTRA-LOW CONTACT RESISTANCE CMOS FORMED BY VERTICALLY-SELF ALIGNED $CoSi_2$ ON RAISED SOURCE DRAIN Si/SiGe" having IBM Docket No. YOR9-2001-0053US1, to U.S. patent application Ser. No. 09/569,306, filed on May 11, 2000, to Chan et al., entitled "A SELF-ALIGNED SILICIDE PROCESS FOR LOW RESISTIVITY CONTACTS TO THIN FILM SILICON-ON-INSULATOR MOSFETS" having IBM Docket No. YOR9-1999-0408US1, each and to U.S. patent application Ser. No. 09/515,033, filed on Mar. 6, 2000, to Brodsky et al., entitled "METHOD FOR SELF-ALIGNED FORMATION OF SILICIDE CONTACTS USING METAL SILICON ALLOYS FOR LIMITED SILICON CONSUMPTION AND FOR REDUCTION OF BRIDGING" having IBM Docket No. YOR9-2000-0044US1 each assigned to the present assignee, and incorporated herein by reference.

U.S. GOVERNMENT RIGHTS IN THE PATENT

The present invention was at least partially funded under Defense Advanced Research Projects Agency (DARPA) Contract No. N66001-97-1-8908, and the U.S. Government has at least some rights under any subsequently-issued patent.

BACKGROUND OF THE INVENTION

1. Field of the Invention

The present invention relates to a semiconductor device, and more particularly to a Si metal oxide semiconductor field effect transistor (MOSFET), and to a method of forming metal silicide contacts to a Si MOSFET.

2. Description of the Related Art

Self-aligned silcide (salicide) is an integral process in the fabrication of high-speed complementary metal oxide semiconductor (CMOS) devices. The salicide process converts the surface portions of the source, drain, and gate silicon regions into a silicide.

FIG. 1 illustrates a structure 100 having a source 101, a drain 102, a gate 103, and a silicided portion 104 of the drain. In FIG. 1, $X_j$ is the source or drain junction depth, $X_{sil}$ is the silicide junction depth and Rp is the peak dopant concentration.

Due to the low sheet resistance of the silicide film, the series resistance to the intrinsic device is minimized. The silicide film must be contained within the source and drain junction or otherwise it would form a leakage path to the substrate. Moreover, to obtain a good ohmic contact, it is desirable to target the silicide/silicon junction to coincide with the peak concentration of the source/drain doping. These requirements are illustrated in FIG. 1. Specially, $X_j$ must be greater than $X_{sil}$, and $X_{sil}$ roughly equals Rp.

That is, scaling the gate length of a MOSFET requires shallow junctions to suppress short channel effects (SCE). The junction depth is expected to become comparable or even thinner than the silicide film thickness. Meeting the shallow junction requirement and maintaining a thick enough silicide film require a revision of the conventional salicide process.

Scaling of the silicon-on-insulator (SOI) MOSFET leads to similar constraints on the salicide process. In the case of SOI, reducing the channel thickness ($t_{si}$) was found to have an important role in suppressing SCE for both single-gate and double-gate MOSFETs (e.g., see H-S. P. Wong et al., Int. Electron Device Meeting (IEDM), p. 407, (1998)).

The use of the conventional salicide process with devices having a very thin SOI channel leads to the following problems.

That is, there may not be enough silicon in the source and drain regions to complete the silicide formation. Furthermore, even a consumption of more than 80% of the silicon film would actually increase the series resistance due to a reduction in the contact area (e.g., see Lisa T. Su et al., Electron Device Letters, 15(9), p. 363, (1994)). Constraints on the silicon consumption by silicide imposed by future bulk and SOI technologies require altering the conventional salicide process to be compatible with ultra-shallow junction technology and ultra-thin SOI films.

Adding silicon selectively to the source, drain, and gate prior to the formation of the silicide film would allow the use of the conventional silicide process with shallow junctions and thin SOI devices. Such thickening of the source and drain may be achieved by selective epitaxy, a process that adds silicon only to the source, drain, and gate regions.

FIG. 2 illustrates a MOSFET structure having a silicon substrate 1, a shallow junction 2, a gate dielectric 3 formed under the gate 4, with a thickened silicon source and drain 6 formed by epitaxy. The Si epitaxy must be selective. Otherwise, silicon will be deposited on the device sidewalls 5 (e.g., gate spacers) which would short the source and drain to the gate 4.

However, selective silicon epitaxy usually requires relatively high growth temperatures, which may lead to dopant redistribution and dopant deactivation. Moreover, since the growth is selective, the process is very sensitive to surface preparation, thereby making it a difficult technique for production. For example, the existence of even a mono-layer of oxide would prohibit the silicon growth.

SUMMARY OF THE INVENTION

In view of the problems discussed above and other problems, disadvantages, and drawbacks of the conventional methods, an object of the present invention is to provide a self-aligned (salicide) method which is applicable to devices having shallow junctions and/or thin SOI films.

It is noted that, for the sake of simplicity, the method (and structure) discussed herein is for the specific case of Cobalt (Co) silicide. Although Co silicide may be of special interest due to its superior properties, the method is general and applicable to silicides formed with other metals such as Ti, Pt, Ni, Pd, W, etc.

In a first aspect of the invention, a method (and resultant structure) for forming a metal silicide contact on a silicon-containing region having controlled consumption of said silicon-containing region, includes implanting Ge into the silicon-containing region, forming a blanket metal-silicon mixture layer over the silicon-containing region, reacting the metal-silicon mixture with silicon at a first temperature to form a metal silicon alloy, etching unreacted portions of the metal-silicon mixture layer, forming a blanket silicon layer over the metal silicon alloy layer, annealing at a second temperature to form an alloy of metal-$Si_2$, and selectively etching the unreacted silicon layer.

It is noted that there are two variants of the method. One variant is applicable to shallow Ge implants which amorphize only a very thin portion of the Si surface. The second variant relates to the case where the Ge implant is deeper. The first case does not require a re-crystallization anneal after the Ge implant, since the amorphized film formed by the implant is entirely consumed by monosilicide formation. The second case requires adding an anneal step after the Ge implant and prior to forming the blanket metal-silicon mixture layer.

In a second aspect of the invention, a method (and structure) for forming a metal silicide contact on a silicon-containing region having controlled consumption of the silicon-containing region, includes implanting Ge into the silicon-containing region, implanting a dopant into the silicon containing region, annealing the silicon-containing region to activate dopants, forming a blanket metal-silicon mixture layer over the silicon containing region, reacting the metal-silicon mixture with silicon at a first temperature to form a metal silicon alloy, etching unreacted portions of the metal-silicon mixture layer, forming a blanket silicon layer over the metal silicon alloy layer, annealing at a second temperature to form an alloy of metal-$Si_2$, and selectively etching the unreacted silicon layer.

The above-mentioned second aspect demonstrates that the Ge implant, for controlling the silicide formation, can be combined with the Ge implants routinely performed prior to the dopant implants, even though the Ge implant for silicide formation control requires about ten times the implant dose of that used conventionally before dopant implant. Further, the re-crystallization anneal can be combined with the routinely used dopant activation anneal, even though for re-crystallization a lower temperature anneal (by about 100 C.) is needed.

In a third aspect of the invention, a method (and structure) of forming a semiconductor structure, includes providing a semiconductor substrate to be silicided including a source region and a drain region formed on respective sides of a gate, implanting Ge into the source, drain and gate regions, forming a blanket metal-silicon mixture layer over the silicon-containing region, reacting the metal-silicon film with Si at a first temperature to form a metal-silicon alloy, etching unreacted portions of the metal-silicon mixture, forming a silicon film over the metal-silicon alloy, annealing the structure at a second temperature to form a metal-$Si_2$ alloy, and selectively etching the unreacted Si.

In a fourth aspect of the invention, a method (and structure) for forming a metal silicide contact on a silicon-germanium-containing region at a low formation temperature, includes amorphizing the silicon-germanium-containing region, forming a blanket metal-silicon mixture layer over the silicon-germanium-containing region, reacting the metal-silicon mixture with silicon at a first temperature to form a metal silicon alloy, etching unreacted portions of the metal-silicon mixture layer, forming a blanket silicon layer over the metal silicon alloy layer, annealing at a second temperature to form an alloy of metal-$Si_2$, and selectively etching the unreacted silicon layer.

With the unique and unobvious method and structure of the invention, a new self-aligned silicide process (and resulting structure) for shallow junction and/or thin SOI source and drain contacts is provided. The inventive process reduces the Si consumption from the source and drain, and thus allows silicide formation over shallow junction and on thin SOI films.

The inventive process is also compatible with single-gate and double-gate MOSFET structures having non-planar source and drain, and in addition, by amorphizing a SiGe alloy, the silicide formation temperature in the alloy can be lowered to that of pure Si. Thus, the invention uses Ge implants to control the temperature of the silicide formation.

BRIEF DESCRIPTION OF THE DRAWINGS

The foregoing and other purposes, aspects and advantages will be better understood from the following detailed description of a preferred embodiment of the invention with reference to the drawings, in which:

FIGS. 5–10 illustrate processing steps of a method according to a preferred embodiment of the present invention in which:

FIG. 5 illustrates a self-aligned Ge implant is performed into the source, drain, and gate regions;

FIG. 6 illustrates a metal film deposited over the structure;

FIG. 7 illustrates that a first rapid thermal anneal (RTA) forms a CoSi phase and that the unreacted metal is selectively etched;

FIG. 8 illustrates a silicon cap deposited over the structure;

FIG. 9 illustrates a second RTA which forms the $CoSi_2$ phase; and

FIG. 10 illustrates the unreacted Si cap is etched off the structure; and

Figure 1:
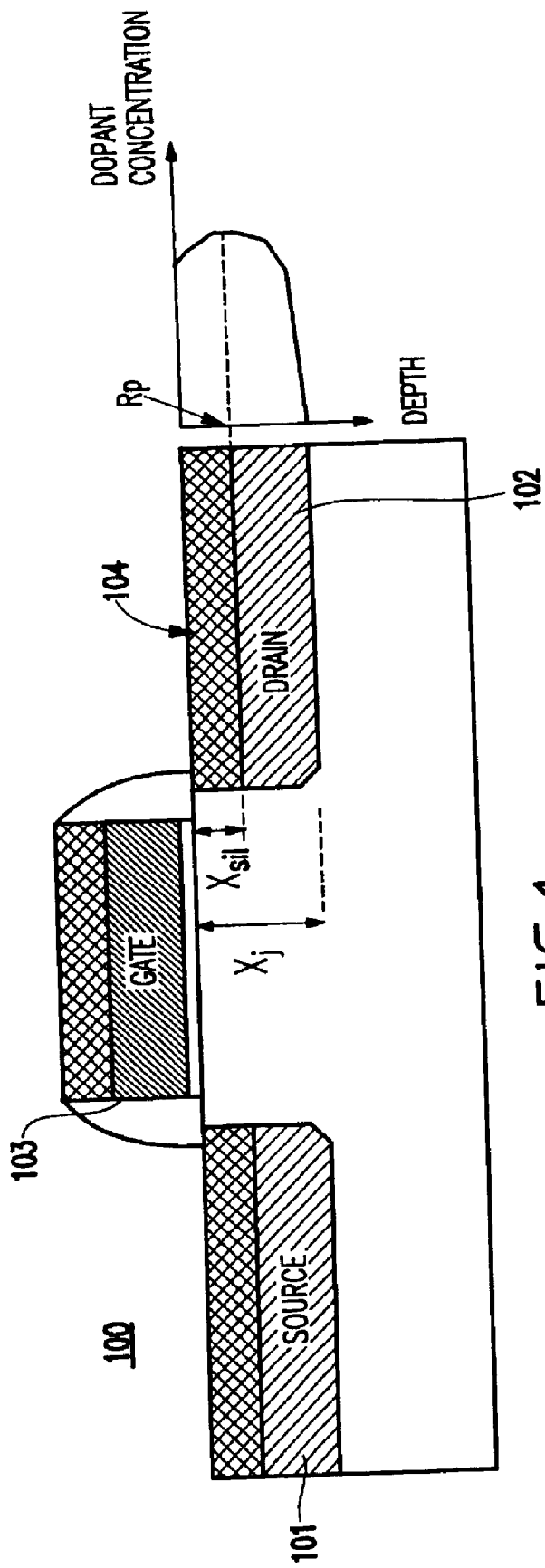
FIG. 1 illustrates design rules for silicide over a bulk MOSFET with shallow source and drain junctions.
Figure 2:
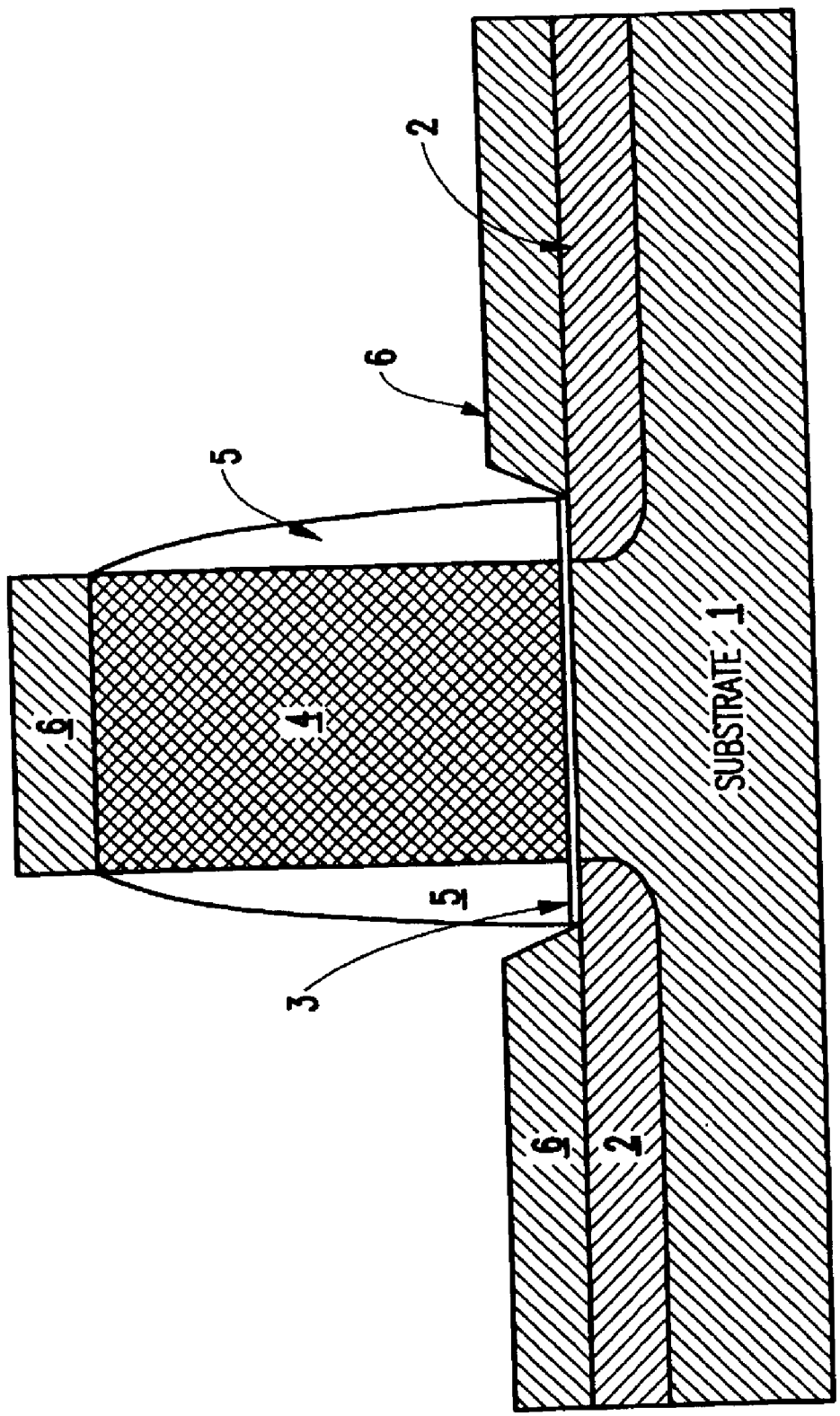
FIG. 2 illustrates a MOSFET structure with thickened silicon source and drain 6 by selective epitaxy.

DETAILED DESCRIPTION OF PREFERRED
Embodiments of the Invention

Referring now to the drawings, and more particularly to FIGS. 3–12B, there are shown preferred embodiments of the method and structures according to the present invention.
Preferred Embodiment Generally, it was recently found that incorporation of Ge into Si would result in a significantly higher formation temperature for the disilicide phase, $CoSi_2$, even for small concentrations of Ge. For example, the $CoSi_2$ formation temperature as a function of the Ge concentration in the Si film is plotted in FIG. 3. As illustrated in the graph, a $Si_{1-x}Ge_x$ alloy, with x=0.03 (3% of Ge) has a disilicide formation temperature higher than 725° C., which is about 100° C. higher than the formation temperature in pure Si (x=0). Thus, the disilicide formation can be better controlled by incorporating Ge into the Si substrate.

The application of Ge to silicide formation was first disclosed in Cohen et. al, "SELF-ALIGNED SILICIDE (SALICIDE) PROCESS FOR STRAINED SILICON MOSFET ON SiGe AND STRUCTURE FORMED THEREBY", having IBM docket YOR9-2000-00373, U.S. patent application Ser. No. 09/712,264, filed on Nov. 15, 2000, and more recently in Cabral et. al, "ULTRA-LOW CONTACT RESISTANCE CMOS FORMED BY VERTICALLY-SELF ALIGNED $CoSi_2$ ON RAISED SOURCE DRAIN Si/SiGe DEVICE", having IBM docket YOR9-2001-0053, each incorporated herein by reference.

While these previously disclosed applications are specific to Si/SiGe structures formed by epitaxy, the present method is general and applicable to conventional bulk and silicon-on-insulator (SOI) structures.

Figure 4:
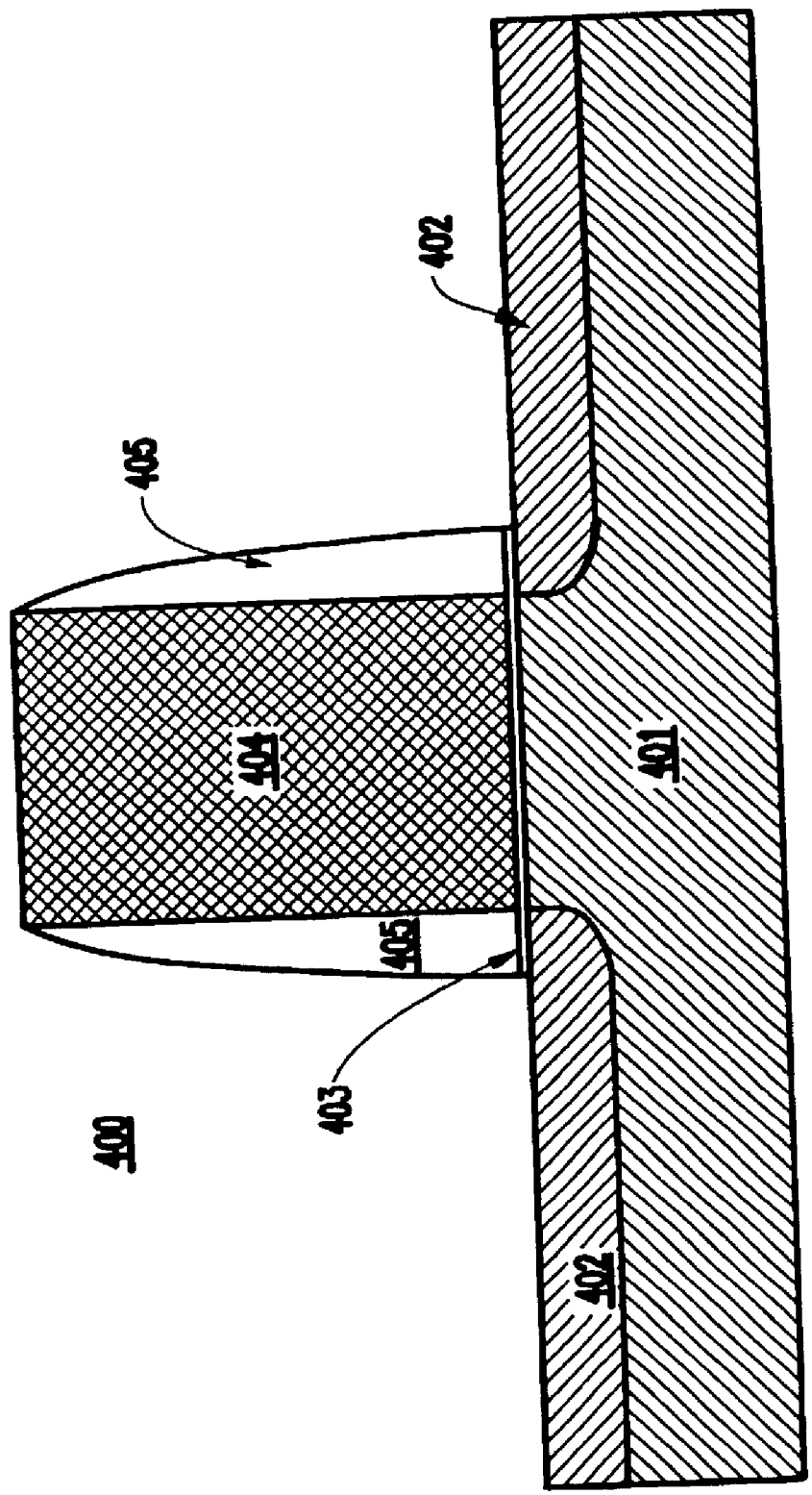
FIG. 4 illustrates a basic MOSFET structure before applying the silicide process.

FIG. 4 shows the initial device structure 400 to be silicided. The structure 400 includes a Si substrate 401, two shallow junction regions 402 that form the source and drain of the device, a gate dielectric 403, a patterned gate 404, and two sidewall spacers 405. The source and drain regions 402 are heavily doped, where the dopant species is a donor or an acceptor based on the device type.

Figure 5:
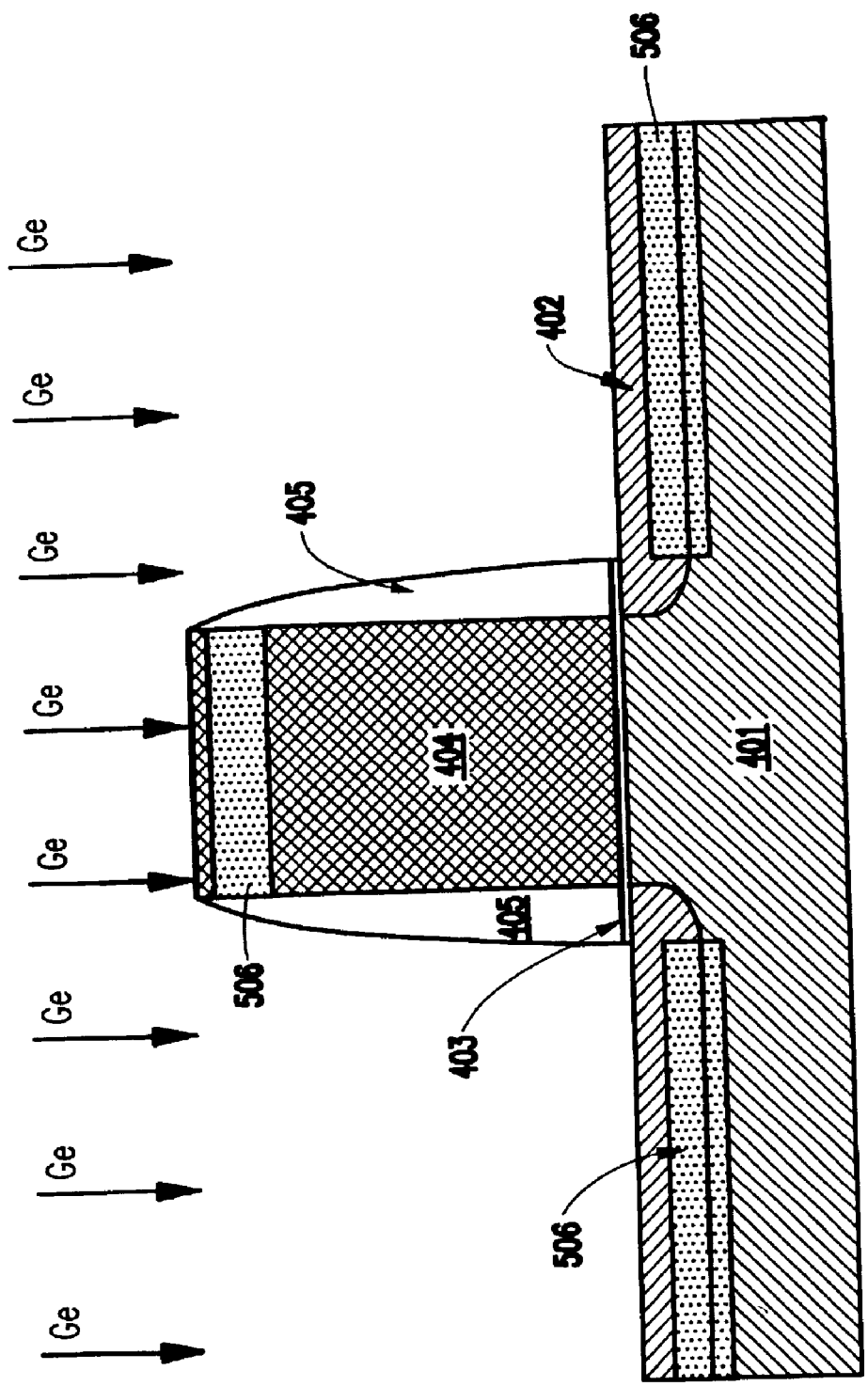

As shown in FIG. 5, the wafer is implanted by a blanket Ge ion implant. The implant introduces Ge into the source and drain regions 402, forming a $Si_{1-x}Ge_x$ alloy 506. The $Si_{1-x}Ge_x$ alloy is self-aligned to the gate 404, source and drain regions 402.

The content, x, of Ge in the Si depends on the implant dose. The typical Ge content in the alloy would be x=0.03 to 0.06, which corresponds to an implant dose of about 1.5E15 $cm^{-2}$ to 3E15 $cm^{-2}$. The Ge content in the $Si_{1-x}Ge_x$ alloy 506 determine $CoSi_2$ formation temperature, as was shown in FIG. 3. The depth of the $Si_{1-x}Ge_x$ alloy 506 from the surface is determined mainly by the implant energy. For example, an implant energy of 2 KeV would result in a projected Ge range in silicon of about 5 nm with a straggle of about 2 nm.

Following the Ge implant, the wafer is annealed to recover from the damage caused by the implant. Generally, a Ge implant having a dose higher than about 1E14 $cm^{-2}$ and at low implant energies (typically <50 KeV) would amorphize the top portion of the silicon wafer down to the projected range of the Ge ions. The anneal re-crystallizes the amorphized silicon by solid phase growth.

It is noted that the Ge implant and subsequent anneal may be carried out prior to the source/drain dopant implants. This would eliminate any concerns of dopant redistribution due to a high temperature process.

Moreover, to achieve shallow junctions, Ge implants with doses of about 3E14 $cm^{-2}$ are carried out prior to the source/drain dopant implants. The Ge implant amorphizes the top portion of the silicon wafer, and thus suppresses ion channeling which otherwise leads to deep junctions.

The Ge implant used in the present silicide process and the Ge implant required for shallow junction fabrication may be combined into one step. In addition, the dopant activation anneal following the source and drain dopant implant could be also used to recover from the Ge implant damage. Thus, both the Ge implant and subsequent re-crystallization anneal can be completely "absorbed" in the fabrication of the shallow junctions.

It will be shown below that re-crystallization annealing is not required for very shallow Ge implants, such as 2 KeV, since the very thin amorphous layer is completely consumed by the metal-rich silicide phase and/or the mono-silicide phase.

Figure 6:
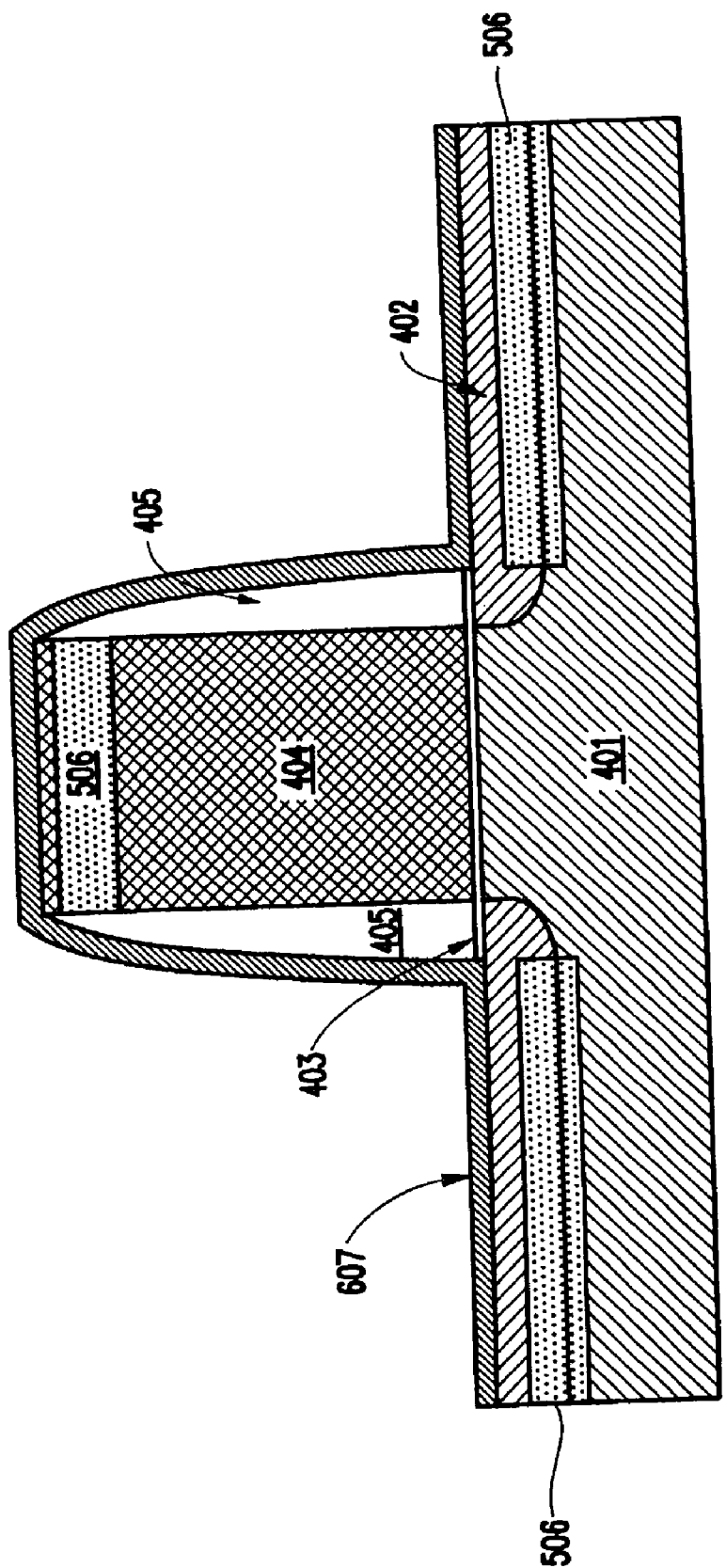

Given that the $Si_{1-x}Ge_x$ alloy 506 was formed by either of the methods discussed above, a thin blanket metal film (e.g., Co in the preferred embodiment due to a cobalt disilicide having a low contact resistance, but, as mentioned above, other metals can be used; in the example described below, Co will be assumed) 607 is deposited over the entire structure. The structure following the metal 607 deposition is illustrated in FIG. 6.

The deposited metal 607 film thickness is determined by the required silicide film thickness. For example, to obtain a 29 nm thick $CoSi_2$ film, the deposited Co film thickness should be about 8 nm. The Co film is usually capped by a TiN or W film (not shown in FIG. 6) to prevent Co oxidation during the anneal.

Figure 7:
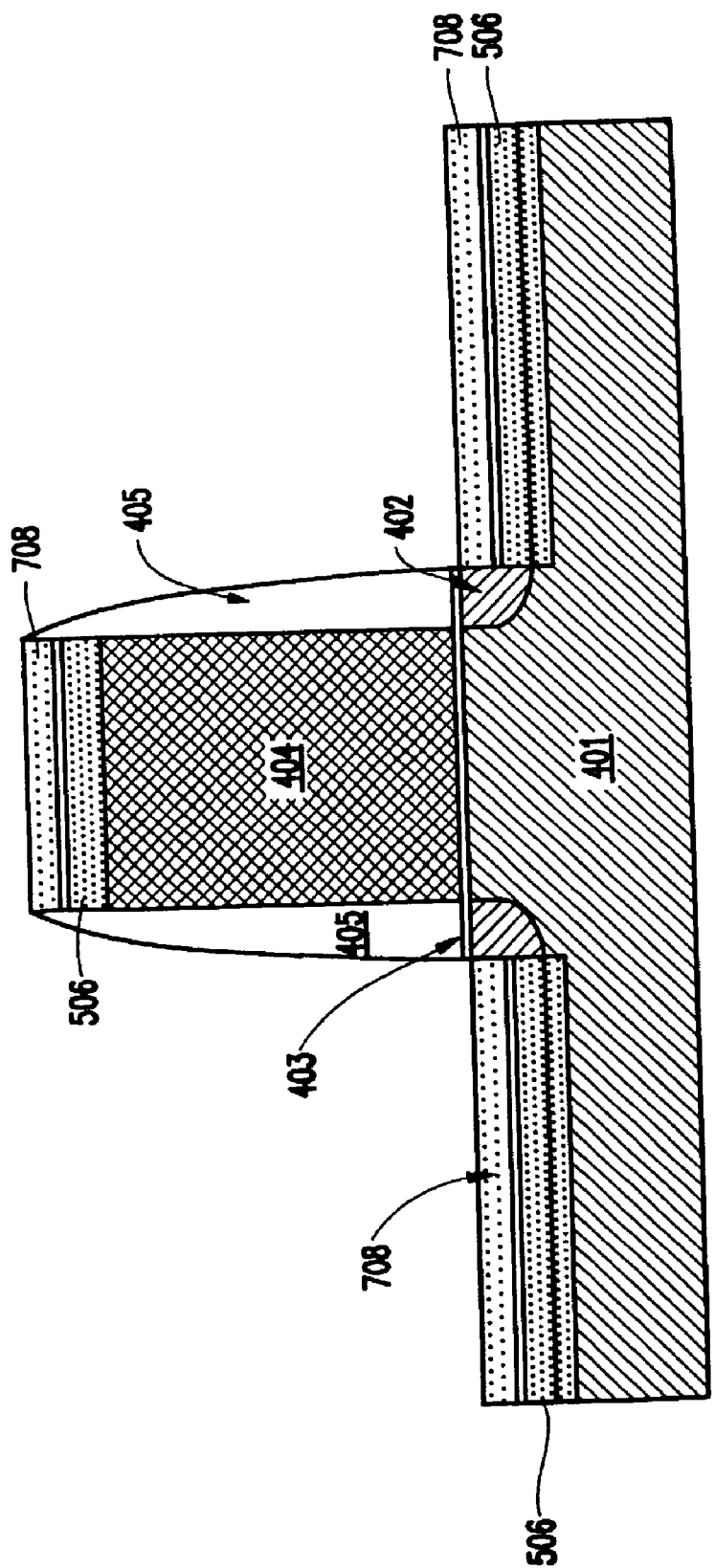

Next, the wafer is annealed by rapid thermal annealing (RTA) to form the mono-silicide phase, CoSi 708 (e.g., see FIG. 7). To form the CoSi phase, an anneal temperature of about 470 C. to about 520 C. is used. The reaction that forms the CoSi film consumes 1.82 nm of silicon for every 1 nm of deposited metal. Following the anneal, the unreacted Co over the dielectric sidewalls and in the field region is etched selectively. The selective etch may use, for example, a sulfuric acid with $H_2O_2$ or the like. The structure following the RTA and the etching of the unreacted Co is illustrated in FIG. 7.

Figure 8:
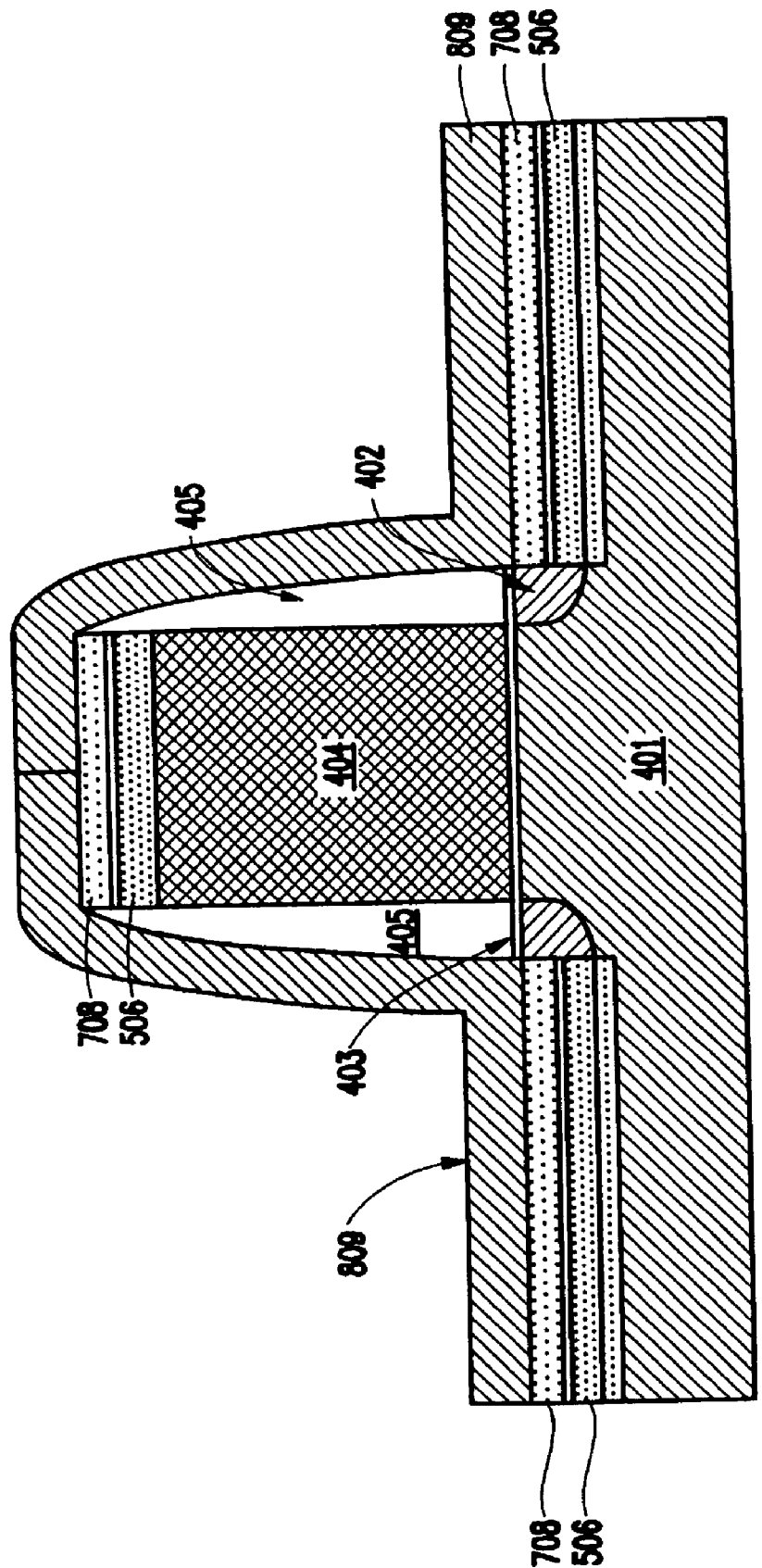

Next, as shown in FIG. 8, a silicon film 809 (such as amorphous or poly-Si) is deposited over the wafer. The structure with the silicon cap 809 is illustrated in FIG. 8. To ensure a clean interface between the CoSi film 708 and the silicon cap 809, a cleaning such as a sputter cleaning is carried out prior to the silicon deposition.

Next, the wafer is given a second RTA anneal to form the disilicide phase, $CoSi_2$ 910.

As discussed above, the incorporation of even small concentrations of Ge in the shallow junction 402 pushes the $CoSi_2$ formation temperature to be significantly higher than the $CoSi_2$ formation temperature in pure Si.

Figure 3:
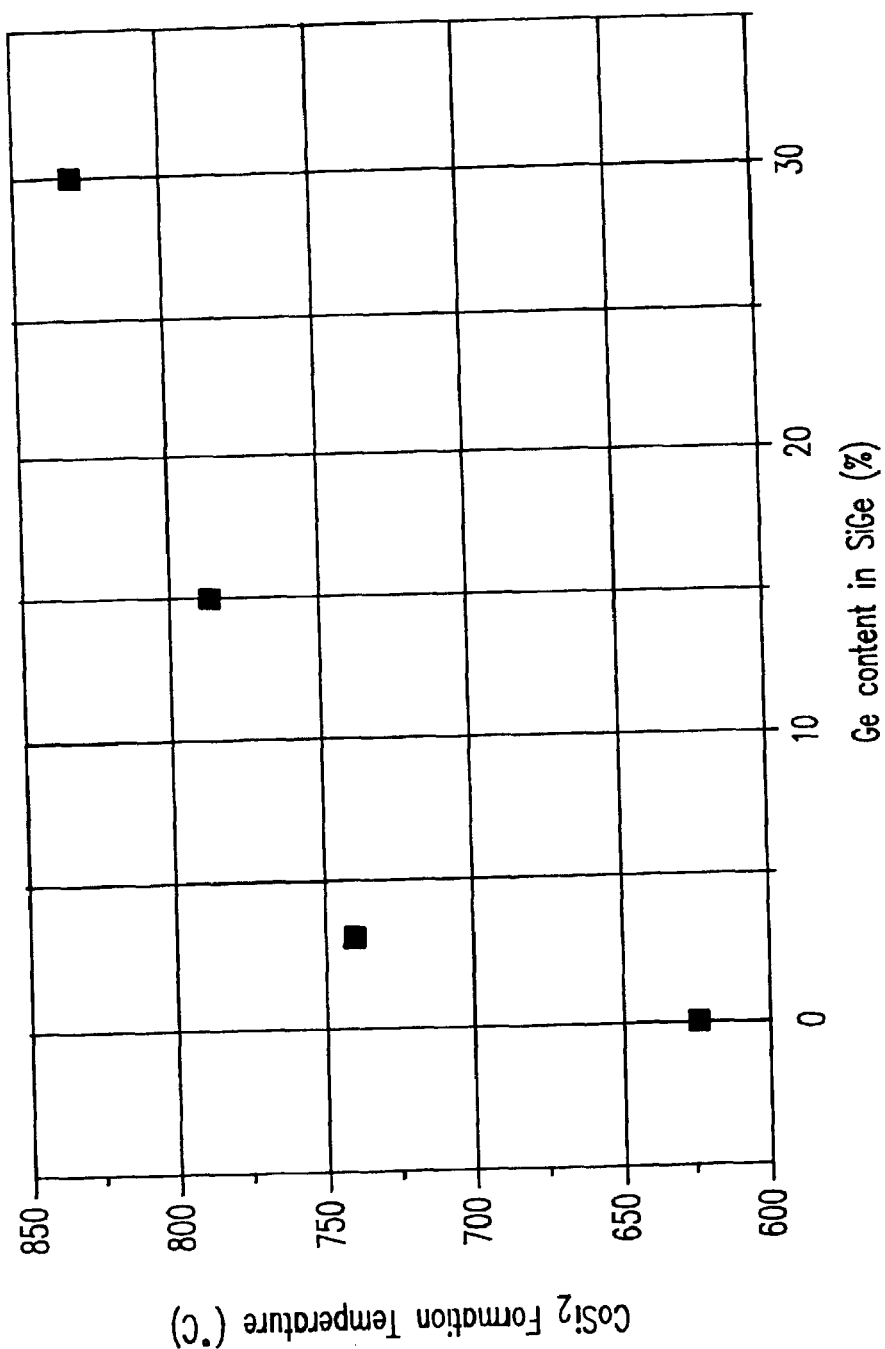
FIG. 3 illustrates $CoSi_2$ formation temperature versus the Ge content in the SiGe alloy.

As noted above, the $CoSi_2$ formation temperature, as a function of the Ge concentration in the Si film, is shown in FIG. 3. If the second anneal temperature is chosen to be lower than the $CoSi_2$ formation temperature in the $Si_{1-x}Ge_x$ alloy 506, then the silicide reaction would be limited only to the Si cap 809. Using this process, the overall Si consumption from shallow junction 402 is reduced by about 50% as compared with the conventional method that does not use the Ge implant and the Si cap deposition.

Figure 9:
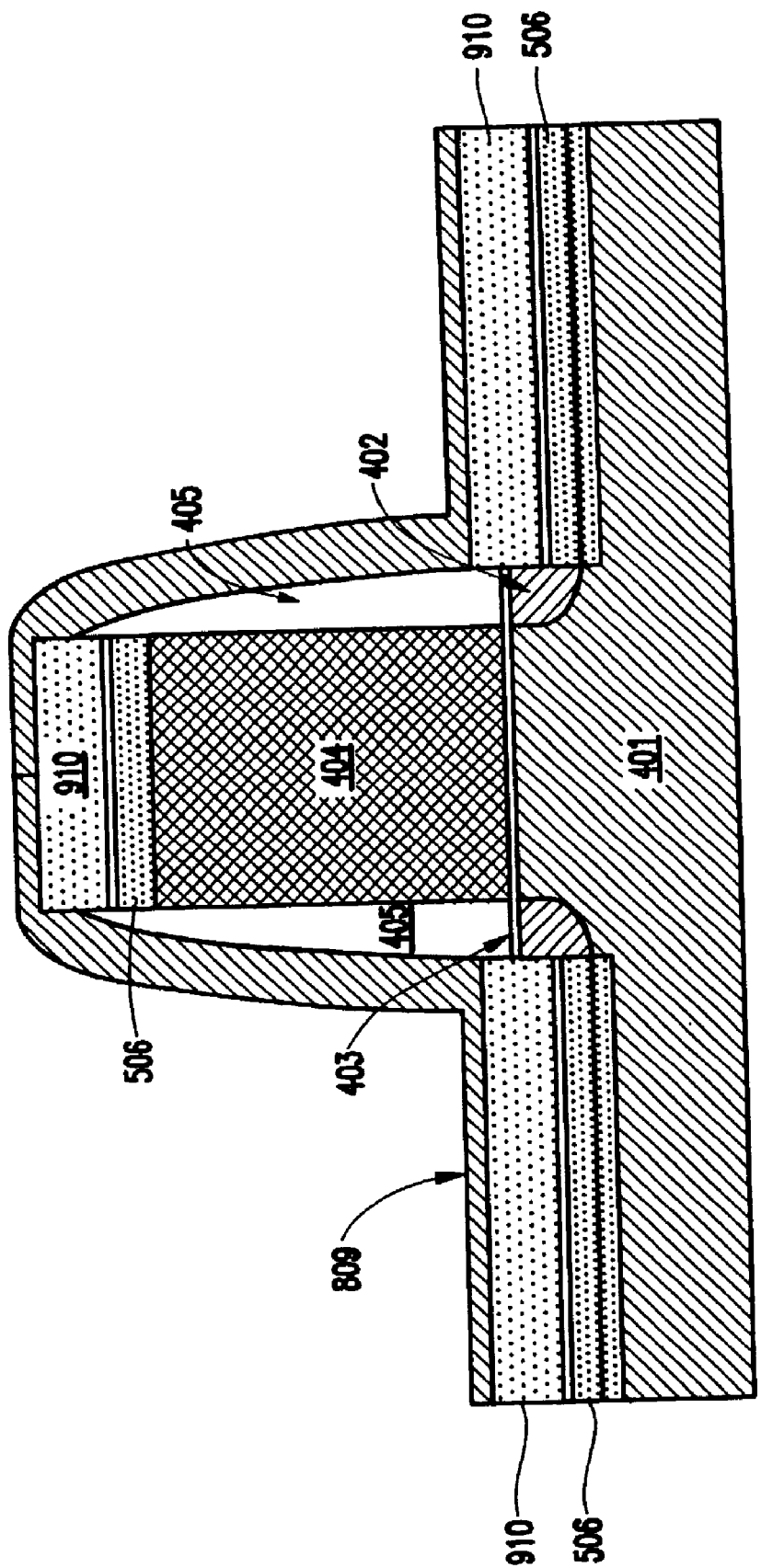

FIG. 9 illustrates the structure following the 2nd RTA which forms the disilicide phase 910 by consuming Si only from the cap 809. For example, in the case of a $Si_{1-x}Ge_x$ alloy 506 with x=0.03, the anneal temperature should be higher than about 625° C. so that the CoSi reacts with the silicon cap 809 to form $CoSi_2$, and should not exceed about 725° C. so that substantially no reaction would occur with the $Si_{1-x}Ge_x$ alloy 506.

Figure 10:
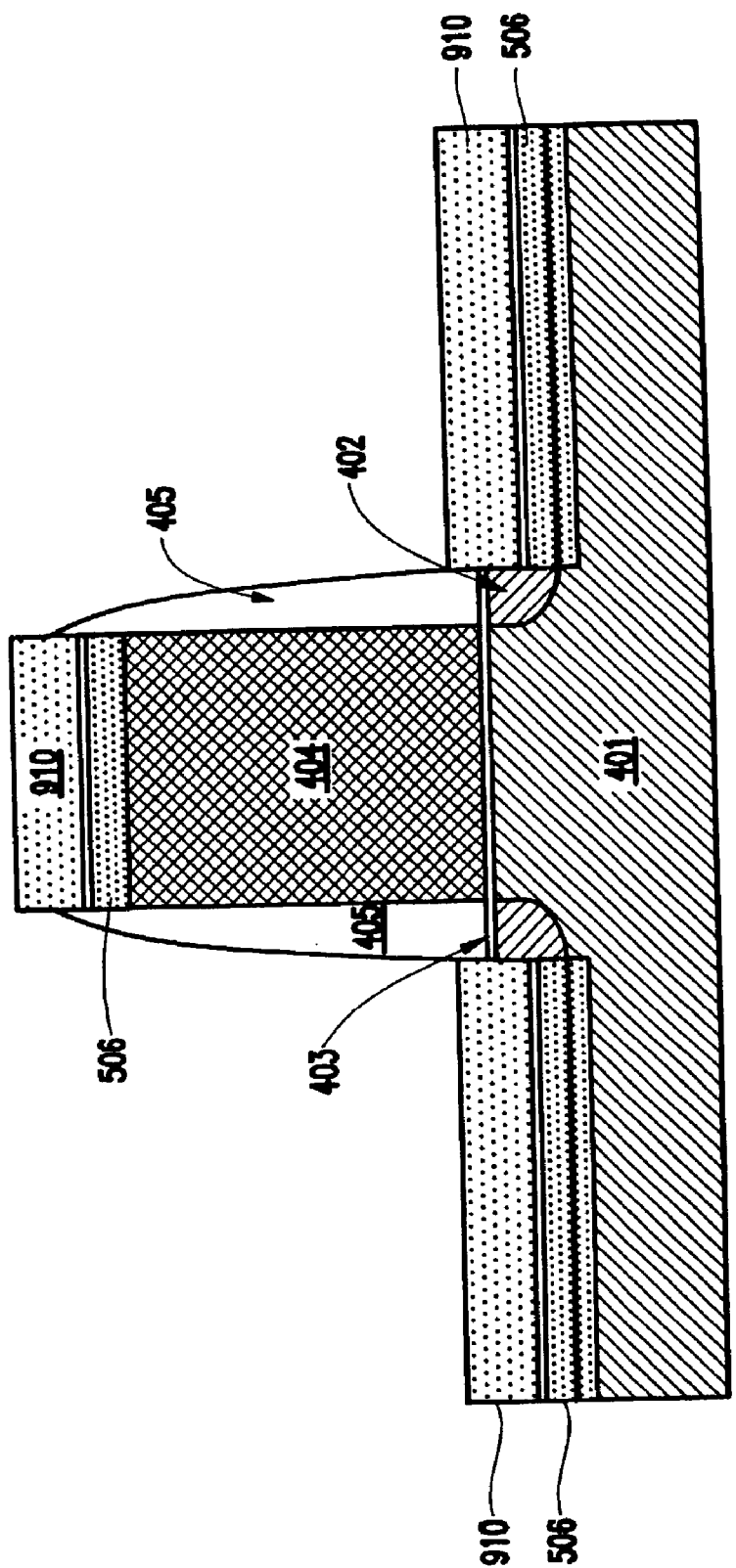

Following the second RTA the unreacted Si cap 809 is removed by a selective etchant such as tetramethylammonium hydroxide (TMAH). The structure following the second RTA and the etching of the unreacted Si cap is illustrated in FIG. 10.

The silicon consumption may be further reduced if a mixture of Co and Si replaces the pure Co film 607 deposition. The process of using Co-silicon mixtures was first disclosed in Cabral et. al, "METHOD FOR SELF-ALIGNED FORMATION OF SILICIDE CONTACTS USING METAL SILICON ALLOYS FOR LIMITED SILICON CONSUMPTION AND FOR REDUCTION OF BRIDGING", having IBM docket YOR8-2000-0018, and U.S. patent application Ser. No. 09/515,033, filed on Mar. 6, 2000, and incorporated herein by reference. Instead of a pure Co deposition, Co is co-deposited with Si. The use of a $Co_{1-x}Si_x$ mixture is limited to about x<0.3. Otherwise, bridging from source/drain to gate can occur. The reduction in the Si consumption from the shallow junction 402 is achieved due to several reasons. Thus, it is noted that the term "metal-silicon mixture" may include pure metal or a combination of metal and silicon.

First, some of the silicon that is required to form the silicide phase is already contained in the deposited mixture, and thus the consumption from the shallow junction 402 is reduced.

Secondly, the temperature window in which the metal rich phase (e.g., $Co_2Si$) is formed is broadened to about 100 C. This allows replacing the first anneal that forms the mono-silicide phase (e.g., CoSi) with a lower temperature anneal that would form the metal rich phase, $Co_2Si$. That would allow the removal of the unreacted Co—Si mixture and the deposition of the silicon cap 809 at an earlier stage of the silicidation process. Thus, silicon consumption is cut by roughly one-half during the formation of the mono-silicide phase (CoSi) due to the supply of silicon being provided from the cap 809. The total reduction in the silicon consumption from the shallow junction 402 is estimated using the following arguments.

That is, initially, the Co—Si mixture is annealed to form the metal rich phase, $Co_2Si$. Assuming that the Co—Si mixture contains about 20% of Si, then the silicon consumption during $Co_2Si$ formation is reduced by about 50% since half of the silicon required to form $Co_2Si$ is present in the deposited Co—Si mixture. Next, the unreacted Co—Si mixture is selectively etched and a Si cap is deposited over the structure. The second anneal forms the mono-silicide phase, CoSi, and then the dicilicide phase, $CoSi_2$. During the RTA, the $Co_2Si$ film which is sandwiched between the shallow junction 402 and the Si cap 809 reacts at both interfaces to form the CoSi phase. Therefore, the consumption of the Si from the shallow junction 402 is reduced by approximately one-half during CoSi formation due to the Si supply from the cap.

The second anneal temperature is chosen preferably to be higher than the formation of $CoSi_2$ in pure silicon but preferably lower than the formation temperature of $CoSi_2$ in the $Si_{1-x}Ge_x$ alloy 506. Since the shallow junction is embedding the $Si_{1-x}Ge_x$ alloy 506, all of the silicon consumption for $CoSi_2$ formation would be provided from to the pure silicon cap 809. In other words, there is no silicon consumption from the shallow junction 402 during the formation of the disilicide phase. Combining the consumption of silicon from each phase yields a 75% reduction in the silicon consumption as compared with the conventional silicide method.

Depending on the reaction rates of CoSi and $CoSi_2$, it may be possible to further reduce the silicon consumption during the second RTA anneal by ramping up the anneal temperature rapidly to the $CoSi_2$ formation temperature. At this temperature, the metal-rich phase can transform directly to $CoSi_2$ without going through the CoSi phase. If the $CoSi_2$ reaction rate is faster than that of CoSi, then the consumption from the shallow junction would be less than about 50% for the CoSi phase.

The present inventors verified experimentally the use of Ge implants as a means to control the silicide formation.

Figure 11:
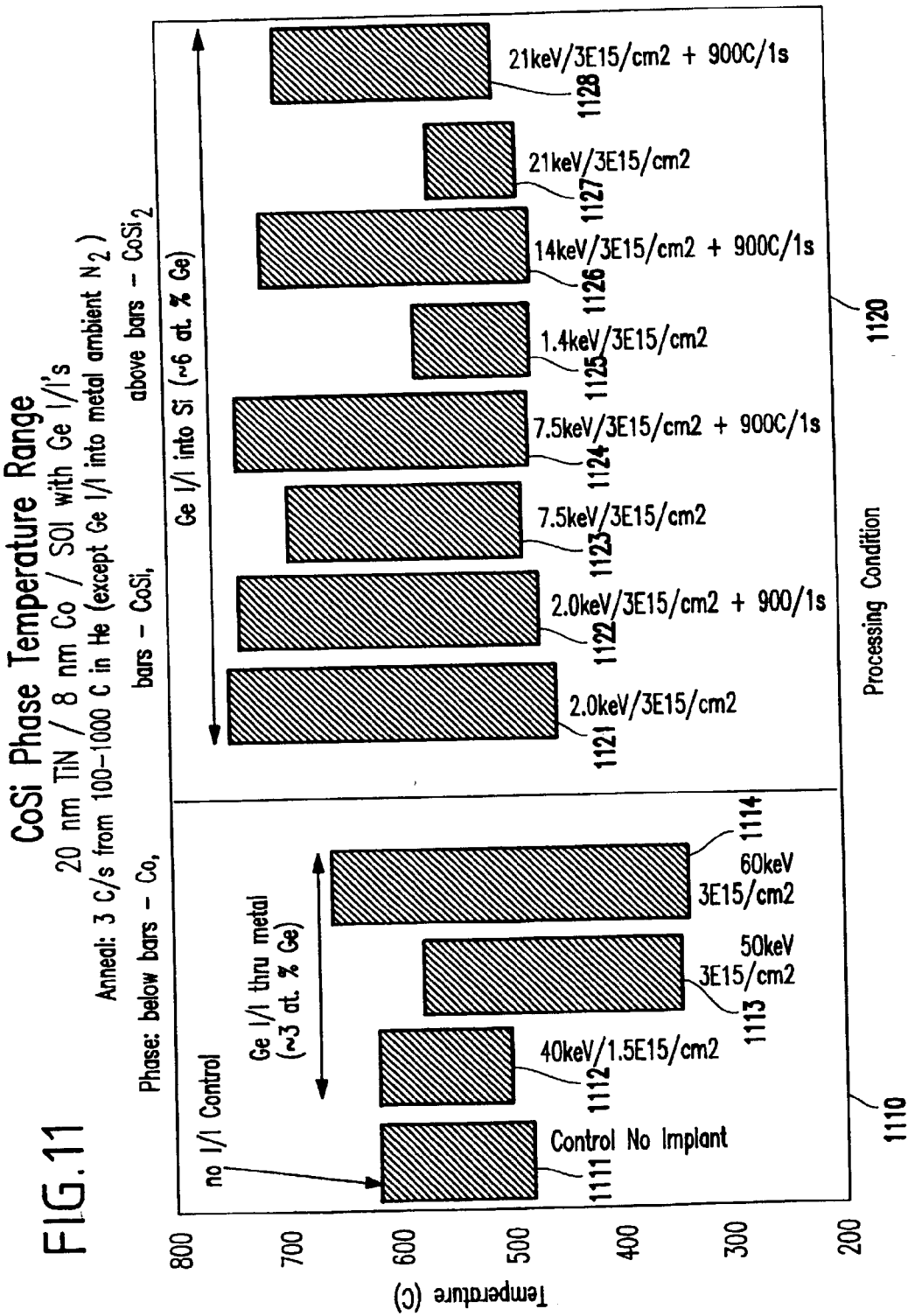
FIG. 11 illustrates the mono-silicide, CoSi, temperature range for different implant conditions.

FIG. 11 shows the temperature range for the mono-silicide phase as a function of the processing conditions. The bars in FIG. 11 indicate that the silicide is in the CoSi phase. Below the bars, the phase is $Co_2Si$ or Co, and above the bars represents that the silicide phase is $CoSi_2$. The Ge implant energies were 2.0, 7.5, 14, and 21 KeV which corresponded to a projection range (Rp) of about 5.4, 10, 15, and 20 nm, respectively. The implant dose was 3E15 $cm^{-2}$, which roughly corresponds to a Ge content of x=0.06. It is noted that, for the higher implants energies, the implanted Ge profile is broader. Thus, the effective Ge concentration is lower than for the shallower implants.

The present inventors also investigated the role of the re-crystallization anneal by carrying out the silicide process with and without the 900 C./1 sec re-cystallization anneal by RTA.

Finally, the present inventors also tested the option of introducing the Ge into the junction AFTER the metal is deposited, by implanting Ge through the metal and the TiN cap.

The implanted Ge samples for which the metal deposition followed the implant clearly show a higher $CoSi_2$ formation temperature as compared with the control sample which did not receive the Ge implant.

For example, the sample that received a Ge implant of dose 3E15 $cm^{-2}$ and energy 2 KeV exhibited a $CoSi_2$ formation temperature of about 750 C., as compared to approximately 625° C. which was obtained with the control sample.

Referring to the annealed samples, there is a moderate decrease in the $CoSi_2$ formation temperature for the higher implant energies. The decrease is probably due to the broadening of the Ge distribution which is associated with deeper implants and due to segregation of Ge to the surface, all of which lead to a lower Ge concentration.

The samples that were not annealed at 900 C./1 sec show a relatively rapid decrease in the $CoSi_2$ formation temperature for the higher implant energies. In particular, the samples that were implanted at 14 KeV and 21 KeV show a lower $CoSi_2$ formation temperature than the control sample. It is important to note that the non-annealed sample implanted with 2 KeV does not exhibit a drop in the formation temperature. This is attributed to the amorphized film generated by the implant being totally consumed during the CoSi phase formation.

Finally, it is noted that the samples that were implanted through the metal with a dose of 3E15 $cm^{-2}$ exhibit a low mono-silicide formation temperature of about 350° C., as compared to about 470° C. which is obtained for the control sample. In addition, these samples do not exhibit the high disilicide formation temperature which was found for the samples implanted before metal deposition. These results and measurements taken for the non-annealed samples suggest that in cases where there is a need to form silicide in a SiGe alloy it is possible to lower the formation temperature of the disilicide by amorphizing the alloy by a Ge implant.

It is noted that, as shown in FIG. 11, the silicide formation temperature can be controlled both ways (e.g., higher or lower). That is, the right side of FIG. 11 (as designated by reference numeral 1120) indicates Ge implants into silicon prior to the metal deposition, whereas the left side 1110 of FIG. 11 indicates no Ge implants into silicon (control sample) and Ge implants into the silicon after the metal deposition. A first bar 1111 indicates no control (e.g., no implants into silicon to manipulate temperature). The bars represent the monosilicide formation temperature. Hence, in the first bar, above approximately 625 C. the monosilicide becomes disilicide. Bars 1112–1114 indicate a Ge implantation through metal and the area above the bars indicates where the monosilicide is converted to disilicide.

Bar 1121 in the right portion 1120 shows that, as Ge has been introduced, the formation temperature for the disilicide has been retarded to about 750 C. However, it is noted that for each set of adjacent bars (e.g., bar 1121 and adjacent bar 1122) there are two conditions present. That is, there is the implantation condition (2.0KeV/3E15 $cm^{-2}$ in the case of bar 1121), but in bar 1122 there is the implantation condition and the anneal temperature (e.g.,. 2.0 KeV/3E15 $cm^{-2}$ and a 900/1s annealing in the case of bar 1122). When Ge is implanted, the silicon is amorphized. Thus, when the sample is annealed after the implant, the silicon is recrystallized.

As shown in FIG. 11, the first two bards 1121 and 1122 show little difference in the formation temperature. However, as higher energy implants are desired, it is apparent that, if no anneal is performed, then the formation temperature drops very quickly and it becomes very similar to the control sample. Hence, the present inventors have recognized that the anneal is very important for control.

Now, turning to the last bar 1114 in the first section 1110, it is noted that a relatively high temperature is needed for silicide formation. Thus, by implanting Ge the silicide formation temperature becomes higher. However, if the Si is amorphized, then the temperature can be reduced. That is, if the higher temperatures to make silicide are not desired, then a SiGe crystal can be implanted such that the crystal becomes amorphous, and the conventional thermal budget can be maintained.

Hence, the invention can control the silicide formation temperature by adding Ge, thereby to make the temperature higher and control where the boundary occurs of the Si-silicide layer.

Alternatively, the invention can take a SiGe substrate, having a single crystal SiGe layer which would normally form a silicide at a very high temperature. However, if a Ge implant is used and there is no recrystallization (e.g., no 900 C. anneal), then the silicide formation temperature would be comparable to silicon.

Figure 12B:
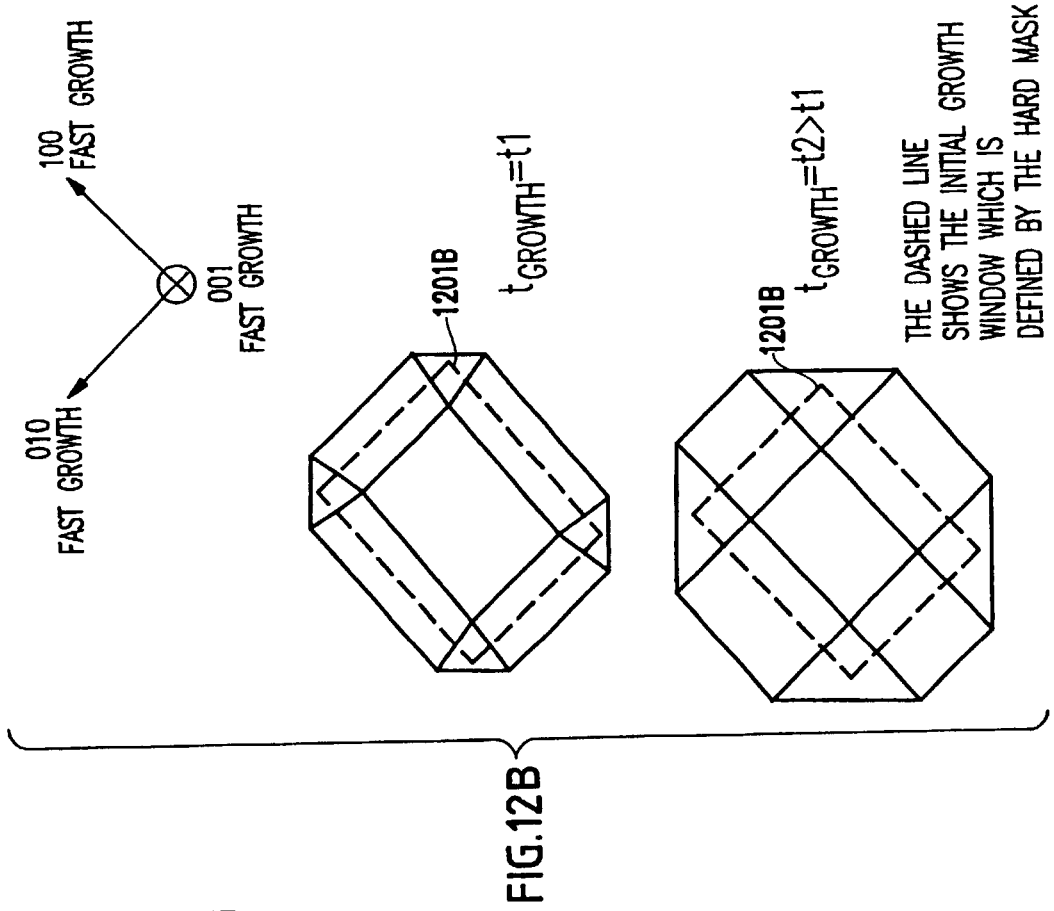
FIGS. 12A and 12B illustrate the novelty of the inventive structure.
Figure 12A:
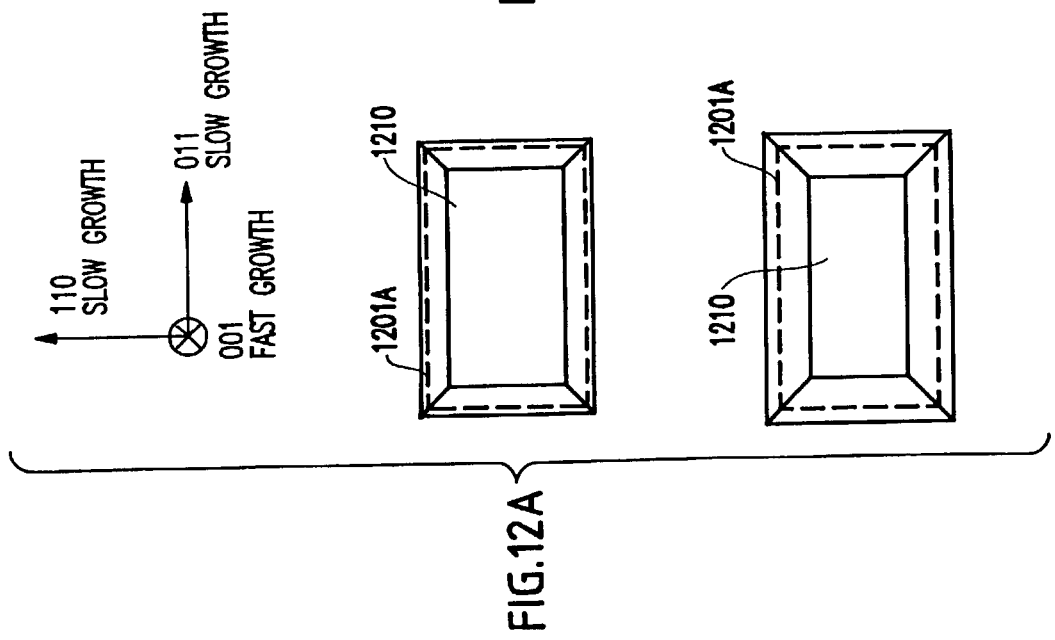

Turning to FIGS. 12A and 12B, it can be clearly seen that the inventive structure is clearly differentiated from a raised source-drain structure formed by selective epitaxy.

That is, for purposes of the present invention, "epitaxy" is defined as "the growth on a crystalline substrate of a crystalline substance that mimics the orientation of the substrate". Keeping this definition in mind, it can be understood that a crystal grown by epitaxy would always be aligned to the underlay substrate, regardless of the orientation of a window that defines a growth region.

FIGS. 12A and 12B respectively illustrate selective epitaxial growth for two different rectangular windows 1201A, 1201B exposing a substrate region 1210. The windows 1201A, 1201B are openings in a mask on which no nucleation occurs. The windows 1201A, 1201B are shown by a dashed line. To further simplify the discussion, only the (100) and (110) sets of planes are considered when looking at the crystal growth.

In FIG. 12A, the left window 1201A defines a rectangle which is perfectly aligned along the 110 and 011 crystal orientation, whereas in FIG. 12B the right window 1201B is aligned with the 010 and 100 orientations. The substrate surface in both windows is aligned with the 001 orientation. It is well known that the growth rate is strongly dependent on the crystal orientation. For the following discussion, it is assumed that the (110) plane set is slow-growing compared to the fast-growing (100) planes. This is illustrated by the coordinate system shown on the top of FIGS. 12A and 12B.

Since the growth rate is dependent on the crystal orientation, the grown crystal would exhibit facets. These faces develop into the slow-growing planes. FIG. 12B shows the grown crystal at two different growth times. At $t_{growth}$=t1, the grown crystal shape is still close to the original window that defines the growth area. However, as the growth proceeds ($t_{growth}$=t2), the slow growing (110) planes become dominant, and the grown crystal no longer follows the shape of the underlay window. As growth would proceed, the shape of the crystal would converge into a pyramid having a base which is oriented along the 110 and 011 orientations (as that of the left window 1201B). As illustrated by FIG. 12A, the grown crystal would maintain the window shape only if the window is aligned to the slow-growing planes.

Therefore, a raised source-drain structure by epitaxy is limited to constraints imposed by the crystal orientation. The shape and the orientation of the window that defines the growth area would not necessarily be replicated to the grown crystal, since it always follows the orientations defined by the underlay crystal substrate.

However, the salicide method of the present invention does not rely on epitaxial growth, and is therefore free of crystal orientation constraints. Thus, in the invention, it does not matter what the crystallographic directions are because the invention does not rely on such directions to form the inventive structure.

Moreover, the raised source-drain formed by the inventive process does not exhibit facets and is defined by the source and drain windows. Hence, the shape that is obtained.

Thus, with the unique and unobvious features of the invention, a new self-aligned silicide process (and resulting structure) for shallow junction and/or thin SOI source and drain contacts is provided. The inventive process reduces the Si consumption from the source and drain, and thus allows silicide formation over shallow junction and on thin SOI films.

The inventive process is also compatible with single-gate and double-gate MOSFET structures having non-planar source and drain (e.g., see P. M. Solomon, H. S. P. Wong, "METHOD FOR MAKING SINGLE AND DOUBLE GATE FIELD EFFECT TRANSISTORS WITH SIDE-WALL SOURCE DRAIN CONTACTS", U.S. Pat. No. 5,773,331, issued on Jun. 30, 1998, and T. Yoshimoto et al., "Silicided Silicon-Sidewall Source and drain structure for high performance 75-nm gate length pMOSFETs," 1995 Symposium on VLSI Technol., digest p. 11, each incorporated herein by reference).

In addition, by amorphizing a SiGe alloy, the silicide formation temperature in the alloy can be lowered to that of pure Si.

While the invention has been described in terms of several preferred embodiments, those skilled in the art will recognize that the invention can be practiced with modification within the spirit and scope of the appended claims.

What is claimed is:

1. A method for forming a metal suicide contact on a silicon-containing region having controlled consumption of said silicon-containing region, said method comprising:

implanting Ge into said silicon-containing region;

forming a blanket metal-silicon mixture layer over said silicon-containing region;

reacting said metal-silicon mixture with silicon at a first temperature to form a metal silicon alloy;

etching unreacted portions of said metal-silicon mixture layer;

forming a blanket silicon layer over said metal silicon alloy layer;

annealing at a second temperature to form an alloy of metal-Si$_2$; and selectively etching said unreacted silicon layer.

2. The method of claim 1, wherein an anneal is carried out following the implanting of Ge.

3. The method of claim 1, further including:

forming said silicon-containing region as a non-planar silicon containing region.

4. The method of claim 1, wherein said metal-silicon mixture comprises pure metal.

5. The method of claim 1, further comprising:

implanting a dopant into said silicon-containing region.

6. The method of claim 1, wherein said forming said blanket metal-silicon layer comprises forming a continuous metal-silicon layer.

7. The method of claim 1, wherein said method is self-aligned whereby said method is devoid of using any of a patterning and a mask.

8. A method for forming a metal suicide contact on a silicon-containing region having controlled consumption of said silicon-containing region, said method comprising:

implanting Ge into said silicon-containing region to amorphize said silicon and to control a suicide formation temperature;

implanting a dopant into said silicon-containing region;

annealing said silicon-containing region to activate dopants and to re-crystallize amorphized silicon;

forming a blanket metal-silicon mixture layer over said silicon-containing region; reacting said metal-silicon mixture with silicon at a first temperature to form a metal-silicon alloy;

etching unreacted portions of said metal-silicon mixture layer;

forming a blanket silicon layer over said metal silicon alloy layer;

annealing at a second temperature to form an alloy of metal-Si$_2$; and selectively etching said unreacted silicon layer.

9. The method of claim 8, wherein said metal-silicon mixture comprises pure metal.

10. The method of claim 8, wherein said method is self-aligned whereby said method is devoid of using any of a patterning and a mask.

11. A method of forming a semiconductor structure, comprising:

providing a semiconductor substrate to be silicided including a source region and a drain region formed on respective sides of a gate;

implanting Ge into said source, drain and gate regions;

forming a blanket metal-silicon mixture layer over said silicon-containing region;

reacting said metal-silicon film with Si at a first temperature to form a metal-silicon alloy;

etching unreacted portions of said metal-silicon mixture;

forming a silicon film over said metal-silicon alloy;

annealing said structure at a second temperature to form a metal-Si$_2$ alloy; and selectively etching said unreacted Si.

12. The method of claim 11, wherein an anneal is carried out following the implanting of Ge.

13. The method of claim 11, wherein said metal includes at least one of Co, Ti, Pd, and Pt.

14. The method of claim 11, wherein said thin film of metal-silicon mixture has a thickness in a range from about 0.3 nm to about 50 nm.

15. The method of claim 11, wherein said metal-silicon mixture film comprises a cobalt-silicon mixture.

16. The method of claim 15, wherein said first temperature is in a range from about 300° C. to about 470° C.

17. The method of claim 11, wherein said silicon film includes one of an amorphous Si (a-Si), a poly-Si, a doped a-Si, a doped poly-Si, and mixtures thereof.

18. The method of claim 11, wherein said reacting for performing a source and drain dopant activation anneal is combined with the annealing, said annealing is for performing a re-crystallization anneal.

19. The method of claim 11, wherein said implanting Ge for controlling the suicide formation is combined with an amorphizing Ge implant for dopant implant.

20. The method of claim 11, wherein said silicon film has a thickness in a range from about 5 nm to about 150 nm.

21. The method of claim 11, wherein said second temperature is higher than approximately 625° C. but lower than the formation temperature of the metal-Si$_2$ in the silicon germanium alloy.

22. The method of claim 11, wherein said metal-silicon formation occurs in the deposited silicon film and in the source region and the drain region and in the gate region.

23. The method of claim 11, wherein said metal-Si$_2$ formation occurs in the silicon film formed over said metal-Si$_2$ alloy.

24. The method of claim 11, wherein said second temperature is higher than said first temperature.

25. The method of claim 11, wherein said method said method is self-aligned whereby said method is devoid of using any of a patterning and a mask.

26. The method of claim 11, wherein said forming of a metal-silicon film includes forming a metal-silicon mixture by co-sputtering metal and silicon, a percentage of said silicon to said metal film being less than approximately 28%.

27. The method of claim 11, wherein said implanting of said source and said drain with Ge for dopants is combined with implanting of Ge for silicide.

28. The method of claim 11, wherein said metal-silicon alloy comprises one of a Co$_2$Si phase and a CoSi phase.

29. The method of claim 11, wherein said metal-silicon mixture comprises pure metal.

30. A method for forming a metal suicide contact on a silicon-germanium-containing region at a low formation temperature, said method comprising:

amorphizing said silicon-germanium-containing region;

forming a blanket metal-silicon mixture layer over said silicon-germanium-containing region;

reacting said metal-silicon mixture with silicon at a first temperature to form a metal silicon alloy;

etching unreacted portions of said metal-silicon mixture layer;

forming a blanket silicon layer over said metal silicon alloy layer;

annealing at a second temperature to form an alloy of metal-Si$_2$; and selectively etching said unreacted silicon layer.

31. The method of claim 30, wherein amorphizing is carried out by an ion implantation.

* * * * *